(12) United States Patent
Jeon

(10) Patent No.: US 6,944,833 B2
(45) Date of Patent: Sep. 13, 2005

(54) DELAY MODEL CIRCUIT FOR USE IN DELAY LOCKED LOOP

(75) Inventor: Young-Jin Jeon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 144 days.

(21) Appl. No.: 10/329,936

(22) Filed: Dec. 26, 2002

(65) Prior Publication Data
US 2004/0054977 A1 Mar. 18, 2004

(30) Foreign Application Priority Data
Sep. 12, 2002 (KR) .................. 10-2002-0055263

(51) Int. Cl.$^7$ .................. G06F 17/50; H03L 7/06
(52) U.S. Cl. .................. 716/1; 327/158
(58) Field of Search .................. 716/1, 6; 327/149–161, 327/276

(56) References Cited
U.S. PATENT DOCUMENTS
6,212,126 B1    4/2001  Sakamoto
6,301,190 B1   10/2001  Tsujino et al.
6,339,553 B1    1/2002  Kuge
6,504,408 B1 *  1/2003  von Kaenel ............... 327/158
2001/0015927 A1  8/2001  Ooishi

FOREIGN PATENT DOCUMENTS
JP   2000-065902   3/2000
JP   2001-195899   7/2001

* cited by examiner

Primary Examiner—Matthew Smith
Assistant Examiner—Paul Dinh
(74) Attorney, Agent, or Firm—Marshall, Gerstein & Borun LLP

(57) ABSTRACT

A delay model circuit for use in a delay locked loop (DLL) of a semiconductor device. The delay model circuit includes a first delay circuit for providing a first delay amount; a second delay circuit having N number of delay load blocks, each having a different load delay amount from others, N being a positive integer; an adjustable load control circuit for generating an adjustable load control signal; and a switching circuit for selectively coupling at least one delay load block to the first delay circuit in response to the adjustable load control signal to thereby allow the delay model circuit to provide a negative delay as a combination of the first delay amount and a second delay amount provided by the selected delay load block.

7 Claims, 5 Drawing Sheets (PRIOT ART)

DELAY MODEL CIRCUIT FOR USE IN DELAY LOCKED LOOP

BACKGROUND

1. Technical Field

A delay locked loop (DLL) is disclosed for use in a semiconductor device that employs a delay model circuit adjustable after the semiconductor circuit fabrication.

2. Description of the Related Art

Generally, a clock is used in various systems and circuitry as a reference for adjusting an operating timing and securing a much faster operation without an error. When an external clock inputted from an external circuit is employed in an internal circuit, a time delay (i.e., a clock skew) results due to the components of the internal circuit. At this time, a delay locked loop (hereinafter, referred to as a DLL) is used to compensate for such a time delay so that the internal clock can have the same phase as the external clock.

Meanwhile, since there is an advantage that the DLLs are not much affected by noises compared with a phase locked loop (PLL) that is typically used, the DLLs are widely used in synchronous semiconductor memory devices, including a double data rate synchronous DRAM (DDR SDRAM). Among them, a register controlled DLL is more generally used.

In the synchronous semiconductor memory device, basically, the register controlled DLL receives the external clock to compensate for delay components of actual clock paths and data paths, and a negative delay is fed back in advance. Through these procedures, the DLL is used to synchronize a data output with the external clock.

FIG. 1 is a block diagram of a conventional register controlled DLL in an SDRAM.

As shown, the conventional register controlled DLL uses an internal clock INT_CLK outputted from a clock input buffer 10. The clock input buffer 10 temporarily stores an external clock EXT_CLK with a voltage level of VDD to generate the internal clock INT_CLK from the external clock EXT_CLK.

The conventional register controlled DLL of the SDRAM includes a clock divider 11, a phase comparator 12, a first delay line 13, a second delay line 14, a delay controller 15, a DLL driver 16, and a delay model circuit 17.

The internal clock INT_CLK is then coupled to the clock divider 11 and the first delay line 13. At the clock divider 11, the internal clock INT_CLK is divided by 1/n (where, n is a positive integer, and in this example, n=4) and a delay monitoring clock DVD4 and an inversed delay monitoring clock DVD4Z are generated. The delay monitoring clock DVD4 is coupled to the second delay line 14 and the inversed delay monitoring clock DVD4Z is provided to the phase comparator 12. The second delay line 14 receives the delay monitoring clock DVD4 to generate a delayed delay monitoring clock which is then coupled to the delay model circuit 17. The delay model circuit 17 has a delay amount for modeling delay components of actual clock paths and data paths to thereby generate a delay model clock signal DVD4_DLY. The phase comparator 12 compares a phase of the delay model clock signal DVD4_DLY from the delay model circuit 17 with that of the inversed delay monitoring clock DVD4Z to generates a comparison signal CPR.

The delay controller 15 controls delay amount of the first and second delay lines 13 and 14 in response to the comparison signal. When the delay is locked, the DLL driver 16 drives an output from the first delay line 13 delay-locked to thereby generate a DLL clock CLK_DLL. Here, the delay controller 15 includes a shift register and a shift controller for controlling a shift direction of the shift register. The delay controller 15 repeatedly controls the delay amount until the delay locking is achieved. Meanwhile, the delay model circuit 17 is a duplicate part of the actual clock path and data path, and determines a negative delay amount of the DLL.

FIG. 2 is a timing diagram of the conventional register controlled DLL shown in FIG. 1. Hereinafter, an operation of the conventional register controlled DLL will be described with reference to FIGS. 1 and 2.

First, the clock divider 11 divides the internal clock INT_CLK by ¼ to generate the inversed delay monitoring clock DVD4Z. At this time, the inversed delay monitoring clock DVD4Z has an opposite phase to that of the delay monitoring clock DVD4.

At an initial operation, the delay monitoring clock DVD4 is passed through only one of unit delay elements contained in the second delay line 14 and is coupled to the delay model circuit 17 which delays the delay monitoring clock DVD4 by a predetermined amount and outputs the delay model signal DVD4_DLY.

Meanwhile, the phase comparator 12 compares rising edges of the inversed delay monitoring clock DVD4Z with those of the delay model clock signal DVD4_DLY to generate the comparison signal CPR. The delay controller 15 determines the delay amounts of the first and second delay lines 13 and 14 in response to the comparison signal outputted from the phase comparator 12.

Then, the delay locking is achieved when the clock has a minimal jitter by repeatedly comparing the inversed delay monitoring clock DVD4Z with the delay model clock signal DVD4_DLY, which results in the DLL driver 16 being driven to generate the DLL clock CLK_DLL synchronized with the external clock EXT_CLK.

As described above, the conventional register controlled DLL generates two divided clocks whose phases are opposite to each other. Among them, the delay monitoring clock DVD4 is delayed as much as D' while passing through the second delay line 14 and as much as R while passing through the delay model circuit 17, so that the delay model clock signal DVD4_DLY outputted from the delay model circuit 17 is delayed as much as D'+R from the delay monitoring clock DVD4. The delay amount D' of the second delay line 14 is repeatedly updated until the delay locking is achieved.

Here, in case where the phase is locked by adjusting D' into D, the rising edge of the inversed delay monitoring clock DVD4Z is synchronized with that of the delay model clock signal DVD4_DLY, a following equation 1 is derived.

$$D+R=2T$$
$$\text{i.e.,} D=2T-R \quad \text{Eq.1}$$

where T denotes a period of an external clock EXT_CLK.

Consequently, the DLL clock CLK_DLL is delayed as much as the delay amount D through the first delay line 13 and, therefore, the DLL clock CLK_DLL has the negative delay as much as the delay amount R of the delay model circuit 17 compared with the phase of the external clock EXT_CLK.

The delay amount R of the delay model circuit 17 represents a negative value of the DLL clock CLK_DLL with respect to the external clock EXT_CLK, and determines how fast the DLL clock CLK_DLL is synchronized with the external clock EXT_CLK. The substantial delay amount R of the delay model 17 is determined through a simulation in the semiconductor design before a semiconductor device fabrication. It is desired the delay amount R should be more accurately estimated in order to secure a fast delay locking operation.

FIG. 3 is a circuit diagram of the conventional delay model circuit 17.

As shown, the conventional delay model circuit 17 includes an inverter chain provided with a plurality of inverters INV1, INV2, INV3, . . . , connected in series, and a plurality of capacitor load portions 20 connected to an inverter node A1 disposed between the inverters INV1 and INV2. Each capacitor load portion 20 includes two switch 21 and 22 and an NMOS transistor 23. The switch 21 is connected between the inverter node A1 and a gate of the NMOS transistor 23 and the switch 22 is disposed between the gate and a source or a drain of the NMOS transistor 23. The NMOS transistor 23 has the source and the drain connected to each other to thereby form a capacitor.

Here, each switch 21 or 22 is constituted with a short/open switch metal, and the delay amount R of the delay model 17 is controlled by increasing or decreasing the number of the capacitors connected to the inverter node A1 and a ground. This operation can be achieved through the selective shorting or opening of the switches 21 and 22.

After completing the fabrication process of the semiconductor chip, a discrepancy between the external clock EXT_CLK and the data output timing may be measured through a test. Then, to compensate such a discrepancy, it is determined which further switches should be shorted/opened according to a test result. If so, in order to obtain such a switch configuration, newly designed masks for the semiconductor fabrication process should be prepared according to the above determination. However, there is a following problem that a new semiconductor chip may be manufactured by using the newly designed mask and, then, should be further determined through the test whether or not it is correctly operated after the fabrication. Furthermore, there may be a considerable process variation in an actual semiconductor chip in a unit of lot. As a result, there is a problem that a conventional controlling process for the delay amount of the delay model circuit 17 cannot cover or timely control such a process variation. At this time, if a semiconductor chip is fabricated completely, there always occurs the case that an operation of the chip may not accurately or quickly synchronized with the external clock EXT_CLK.

Meanwhile, in addition to the register controlled DLL, the delay model circuit is used in other kinds of DLLs, such as a digital DLL, so that the above problems are not limited to only the register controlled DLL.

SUMMARY OF THE DISCLOSURE

A delay model circuit for use in a DLL and a tuning method thereof are disclosed, which are capable of finely controlling a delay amount of the delay model circuit without any newly designed masks or any further additional fabrication process for a new chip.

Further, a delay model circuit is disclosed for use in a DLL capable of easily controlling a delay amount of the delay model circuit according to the fabrication process.

A disclosed delay model circuit, for use in a semiconductor device and for providing a negative delay to a delay locked loop (DLL) of a semiconductor device comprising: a first delay circuit for providing a first delay amount; a second delay circuit having N number of delay load blocks, each having a different load delay amount from others, N being a positive integer; an adjustable load control circuit for generating an adjustable load control signal; and a switching circuit for selectively coupling at least one delay load block to the first delay circuit in response to the adjustable load control signal to thereby allow the delay model circuit to provide the negative delay as a combination of the first delay amount and a second delay amount provided by the selected delay load block.

A method for tuning a delay model circuit for use in a delay looked loop (DLL) of an semiconductor device is also disclosed. The delay model circuit comprises: a first delay circuit for providing a first delay amount; a second delay circuit having N number of delay load blocks, each having a different load delay amount from others, N being a positive integer; an adjustable load control circuit for generating an adjustable load control signal; and a switching circuit for selectively coupling at least one delay load block to the first delay circuit in response to the adjustable load control signal to thereby allow the delay model circuit to provide the negative delay as a combination of the first delay amount and a second delay amount provided by the selected delay load block. The disclosed method comprises: a1) selecting one of delay load blocks by controlling the adjustable load control signal; a2) testing a synchronization between an external clock and a data output timing of the semiconductor device; a3) repeating the steps a1) and a2) until the synchronization is obtained; and a4) fixing an adjusted load control signal at the synchronization.

Thus, the delay mode circuit includes a plurality of delay load blocks with different load values and a fuse circuit block. The delay amount of the delay model circuit in the delay lock loop is tuned using a combination of the test mode signals that are used to test a semiconductor chip, and the combination of the tuned or adjusted test mode signals can be fed back even at the normal mode. Therefore, since it is not necessary to manufacture new masks or perform new processes, the manufacturing cost as well as a manufacturing time can be remarkably reduced. Further, it is possible to easily cope with the variations in the manufacturing process of the chip according to semiconductor lots.

BRIEF DESCRIPTION OF THE DRAWINGS

Other aspects of the disclosed devices and methods will become apparent from the following description of the embodiments with reference to the accompanying drawings, wherein.

DETAILED DESCRIPTION OF THE PRESENTLY PREFERRED EMBODIMENTS

Hereinafter, preferred embodiments disclosed devices and methods will be descried in detail with reference to attached drawings.

Figure 1:
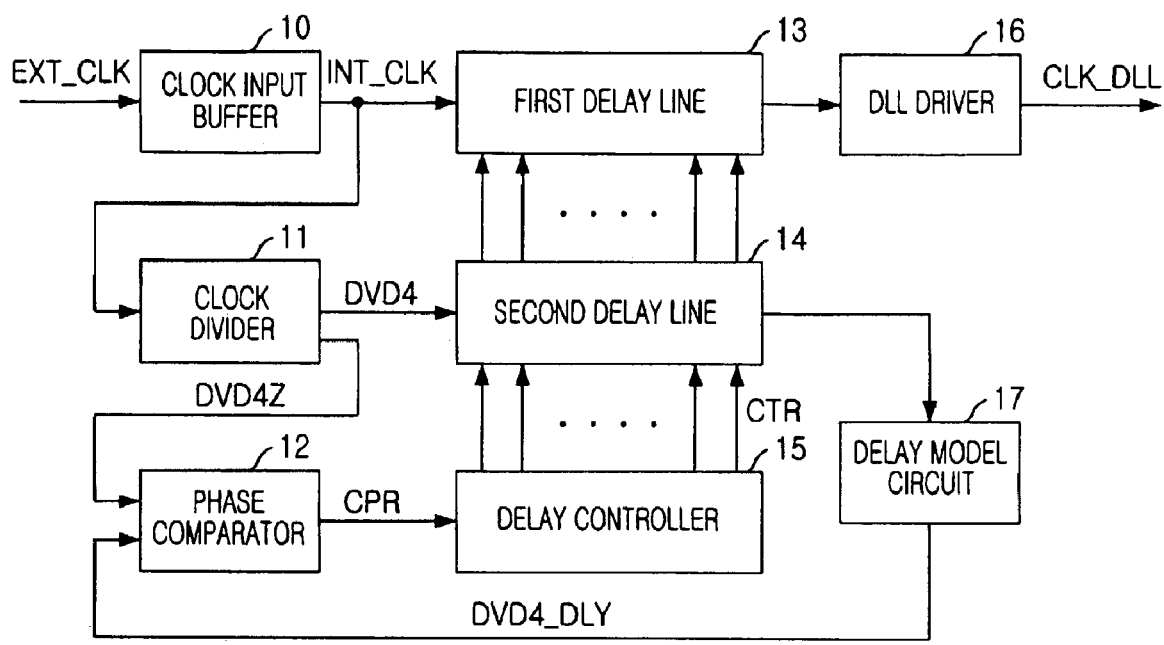
FIG. 1 is a block diagram showing a conventional register controlled DLL of an SDRAM.
Figure 2:
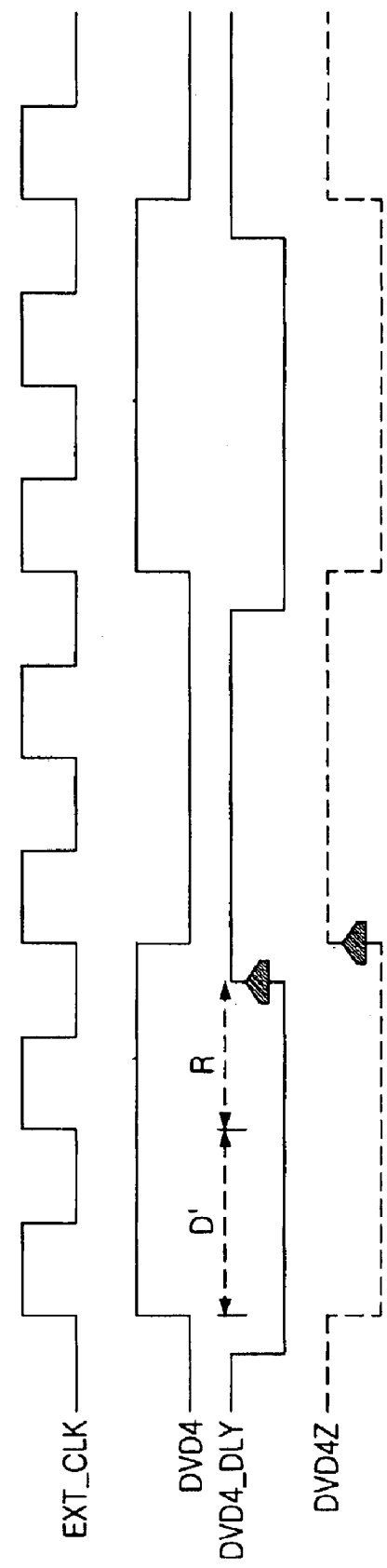
FIG. 2 is a timing diagram of the conventional register controlled DLL shown in FIG. 1.
Figure 3:
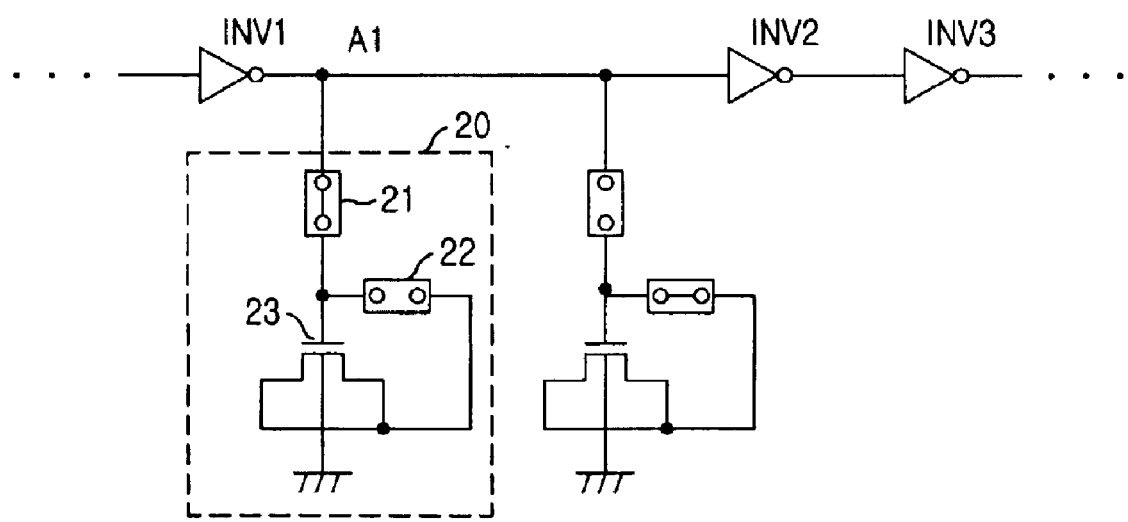
FIG. 3 is a circuit diagram illustrating a conventional delay model circuit of the DLL.
Figure 4:
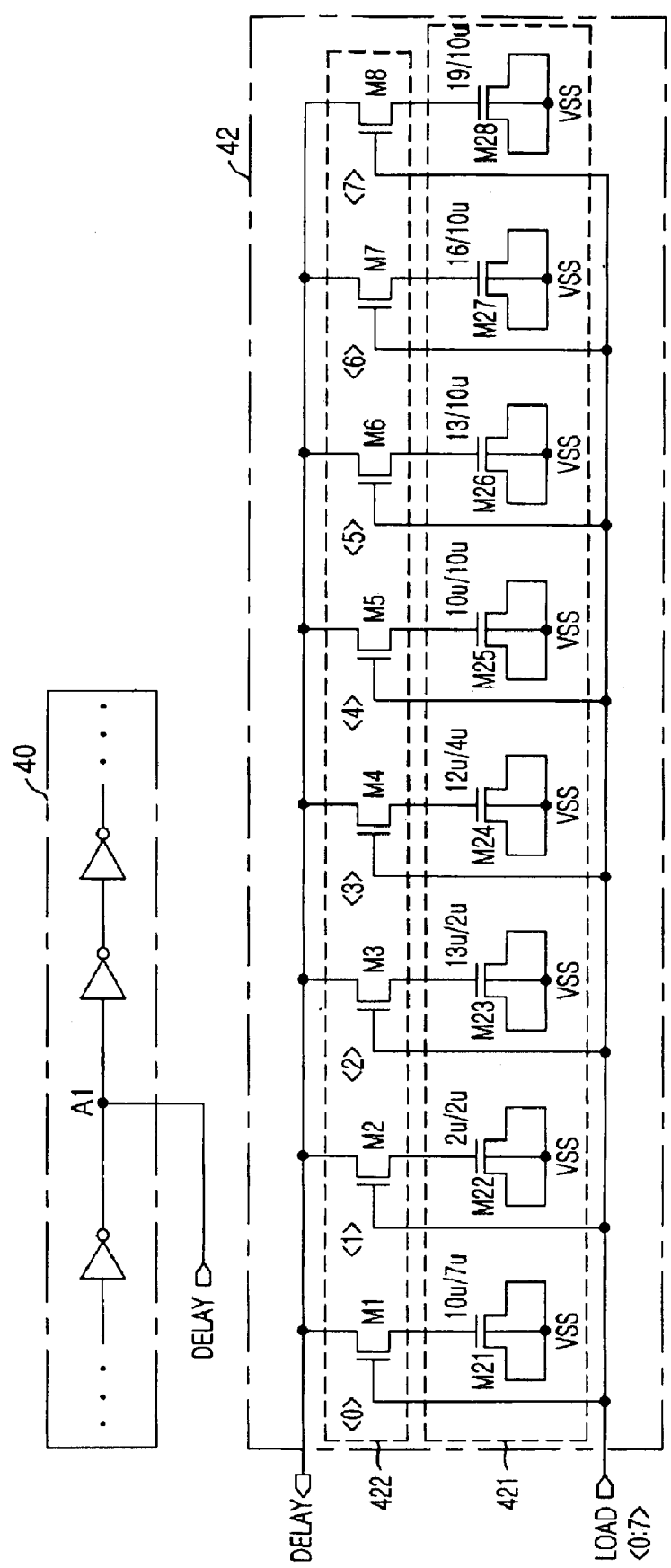
FIG. 4 is a circuit diagram demonstrating a delay model circuit of a DLL in accordance with a disclosed embodiment.

FIG. 4 is a circuit diagram showing a delay model circuit of a DLL in accordance with a disclosed embodiment.

As shown, the disclosed delay model circuit of the DLL includes an inverter chain 40 and a capacitor load circuits 42. The inverter chain 40 is provided with a plurality of inverters connected in series, and the capacitor load circuit 42 is connected to one node A1 of the inverter chain 40 through a line DELAY.

The capacitor load circuit 42 includes a capacitor load block 421 and a switching block 422. The capacitor load block 421 contains N, e.g., 8 capacitor-connected NMOS transistors M1 to M8 connected in parallel via the switching block 422 to one inverter node A1, N being a positive integer. The switching block 422 includes N, e.g., 8 switching NMOS transistors M1 to M8, each connected between each capacitor-connected NMOS transistor and the inverter node A1. A gate of each switching NMOS transistor M1 to M8 is controlled by using each bit of a load control signal LOAD<0:7>. Each of the capacitor-connected NMOS transistors M21 to M28 has a source/drain and a channel connected to a ground voltage VSS. Each of the capacitor-connected NMOS transistors M21 to M28 has a channel width/length different from each other to thereby have a different load value from each other. For example, a capacitor-connected NMOS transistor M21, which is selectively coupled to the inverter node A1 through the switching MOS transistor M1 by using a first bit LOAD<0> of the load control signal LOAD<0:7>, has the channel width/length of 10 $\mu$m/7 $\mu$m, and a capacitor-connected NMOS transistor M22, which is selectively coupled to the inverter node A1 via the switching MOS transistor M2 by a second bit LOAD<1> of the load control signals LOAD<0:7>, has the channel width/length of 2 $\mu$m/2 $\mu$m. The channel width/length can be preferably selected in a semiconductor device design process considering possible delays contained therein.

Figure 5:
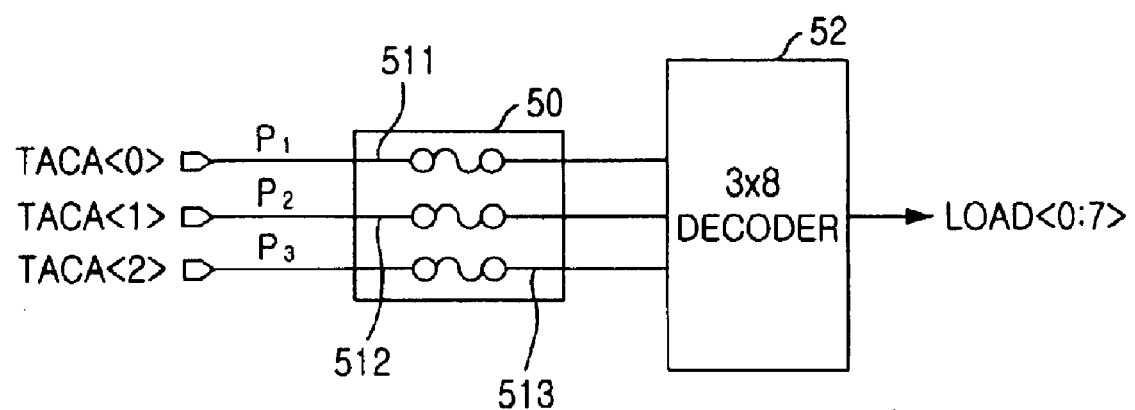
FIG. 5 is an exemplary diagram of a circuit for generating a load control signal LOAD<0:7> shown in FIG. 4.

FIG. 5 is an exemplary diagram of a load control circuit for generating the load control signal LOAD<0:7> shown in FIG. 4.

As shown, the load control circuit can be implemented in the delay model circuit to generate the load control signal LOAD<0:7> and includes a fuse circuit block 50 and a 3×8 decoder 52. The fuse circuit block 50 receives a test mode signal TACA<0:2> issued from an external circuit (not shown) or by user.

Here, the fuse circuit block 50 includes, e.g., 3 fuses connected to input ports P1 to P3 for receiving respective bit signals TACA<0> to TACA<2> of the test mode signal TACA<0:2>. The fuse circuit block 50 also includes a power supply circuit (not shown). If the test mode signal TACA<0:2> is not applied from the external circuit or user, one or more fuse can be blown out in order to generate the test mode signal TACA<0:2>. That is, if the fuse 511 is shorted, by the power supply circuit, the test mode signal TACA <0> becomes a logic low level signal and, if the fuse 512 is cut, by the power supply circuit, the test mode signal TACA becomes a logic high signal in order not to float output ports of the fuse circuit block 50.

Hereinafter, a method of tuning the delay model circuit will be described in detail with reference to FIGS. 4 and 5.

Primarily, a specific test mode signal TACA <0:2> used to test the semiconductor chip manufactured according to a desired specification is assigned as the specific test mode signal for tuning the delay model circuit. In response to the specific test mode signal TACA <0:2>, the load control circuit generates the load control signal LOAD<0:7> for selectively coupling one or more capacitor-connected NMOS transistor M21 to M28 as delay loads. At this time, in a state that the fuse is not cut, it is checked whether or not the external clock EXT_CLK is synchronized with the chip operation (e.g., a data output timing). If there are some problems on the synchronization process, the load control signal LOAD<0:7> is changed by a new bit combination of the test mode signal TACA<0:2> in a predetermined procedure. Since the capacitor-connected NMOS transistors M21 to M28 can be selectively coupled to the inverter chain 40 as the delay loads according to the load control signal LOAD<0:7>, the delay amount of the inverter chain 40 can be finely adjusted in an effective manner.

For example, in case where the test mode signal TACT<0:2> has the bit combination of '0, 0, 1' (means(1, 0, 0)), an output of the 3×8 decoder 52 is '00001000' and thus the capacitor load circuit 42 turns on the switching NMOS transistor M5, so that a load value corresponding to a capacitance of the capacitor-connected NMOS transistor M25 having the channel width/length of 10 $\mu$m/ 10 $\mu$m is transferred to the inverter node A1. At this time, a total delay amount of the delay model circuit is equal to a sum of the inherent delay amount of the inverter chain 40 and the delay amounts caused by the selected load value of the capacitor load circuit 42.

If finding the preferred combination of the test mode signal TACA<0:2> synchronizing the external clock EXT_CLK with the chip operation, the cutting of the fuse is carried out so that a test mode coding can be maintained even at the normal operation of the chip.

For example, in case where the test mode signals TACA<0:2> is the combination '0, 0, 1' in the test mode coding, the first and second fuses are not cut. Also, if a third fuse is cut, the fuse circuit block 50 always outputs '0, 0, 1' at the normal node, so that the test mode coding is maintained even at the normal mode.

Accordingly, it is not necessary to manufacture new masks or perform new processes according to the test results, thereby easily covering the process or changing parameter variations according to the fabrication environment of the semiconductor chip.

While the disclosed circuits and methods have been described with respect to certain preferred embodiments only, other modifications and variation may be made without departing from the spirit and scope of this disclosure as set forth in the following claims.

As described above, although the inverter chain is described as an example so as to provide the locked delay amount of the delay model circuit, the disclosed circuits are applicable to other delay units for providing the locked delay amount.

Additionally, although the NMOS transistors are described as an example of the switching devices for selecting the capacitor blocks, switching devices (e.g., PMOS transistors), which are electrically controllable, can be substituted for the NMOS transistors.

Further, although the capacitor load circuit is described as an example of a device for providing the variable load values so as to tune the delay amount of the delay model circuit, the disclosed delay model circuits are applicable to other load devices in addition to the capacitor.

Furthermore, although it is described the case that the eight variable load values are selected using the three test mode signals, the disclosed circuits and methods of operation thereof are also applicable when a number of the test mode signals and a number of the variable load values are increased or decreased.

Since the disclosed delay model circuits of the DLL can omit the manufacture of the new mask or the new processes for tuning the delay amount of the delay model circuit, the disclosed circuits have an effect that the manufacturing cost of the chip as well as the manufacturing time can be remarkably reduced.

What is claimed is:

1. A delay model circuit for providing a negative delay to a delay locked loop (DLL) of a semiconductor device, comprising:

a first delay circuit for providing a first delay amount;

a second delay circuit having N number of delay load blocks, each having a different load delay amount from others, N being a positive integer;

an adjustable load control circuit for generating an adjustable load control signal, wherein the adjustable load control circuit includes an input port for receiving an adjustable test mode signal having M number of bits, M being a positive integer; and a decoding circuit for generating the adjustable load control signal having N number of bits by decoding the adjustable test mode signal, each bit employed in controlling each electrically controllable switch device; and a switching circuit for selectively coupling at least one delay load block to the first delay circuit in response to the adjustable load control signal to thereby allow the delay model circuit to provide the negative delay as a combination of the first delay amount and a second delay amount provided by the selected delay load block.

2. The delay model circuit as recited in claim 1, wherein said switching circuit includes N number of electrically controllable switching devices, each coupled between the first delay circuit and each delay load block.

3. The delay model circuit as recited in claim 2, wherein each of the electrically controllable switching devices includes a MOS transistor.

4. The delay model circuit as recited in claim 1, wherein the delay load block includes a capacitor-connected NMOS transistor.

5. The delay model circuit as recited in claim 1, wherein the first delay circuit includes a plurality of inverters connected in series to each other.

6. The delay model circuit as recited in claim 1, wherein said adjustable load control circuit further includes a fuse circuit and a power source for maintaining an adjusted test mode signal, wherein the fuse circuit includes M number of fuses for M number of bits of the adjusted test mode signal.

7. The delay model circuit as recited in claim 6, wherein N is 8 and M is 3.

* * * * *